(12) United States Patent
Nakamura

(10) Patent No.: US 7,602,247 B2
(45) Date of Patent: Oct. 13, 2009

(54) VARIABLE GAIN AMPLIFIER AND AC POWER SUPPLY DEVICE USING THE SAME

(75) Inventor: Masafumi Nakamura, Mie (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/915,018

(22) PCT Filed: Aug. 28, 2006

(86) PCT No.: PCT/JP2006/316853

§ 371 (c)(1),
(2), (4) Date: Nov. 20, 2007

(87) PCT Pub. No.: WO2007/026639

PCT Pub. Date: Mar. 3, 2007

(65) Prior Publication Data

US 2008/0197822 A1 Aug. 21, 2008

(30) Foreign Application Priority Data

Aug. 31, 2005 (JP) ............................. 2005-251155

(51) Int. Cl.
*H03F 3/45* (2006.01)
(52) U.S. Cl. .................................... 330/254; 330/257
(58) Field of Classification Search ................. 330/254, 330/257
See application file for complete search history.

(56) References Cited

U.S. PATENT DOCUMENTS 6,084,471 A * 7/2000 Ruth et al. ................... 330/254

FOREIGN PATENT DOCUMENTS

JP 61-075610 4/1986

(Continued)

OTHER PUBLICATIONS

International Search Report Dated Dec. 5, 2006.

*Primary Examiner*—Steven J Mottola
(74) *Attorney, Agent, or Firm*—Pearne & Gordon LLP

(57) ABSTRACT

A variable gain amplifier includes first and second power supply terminals arranged to be connected to a power supply, a transconductance amplifier, first and second PN junction elements, a voltage drop element, first and second resistors, a current-generating transistor, and a current mirror. The transconductance amplifier outputs a current corresponding to a difference between a potential of a base of the first initial stage transistor and a potential of a base of the second initial stage transistor. An emitter of the second initial stage transistor is connected to the emitter of the first initial stage transistor at a node. Each of the first and second PN junction elements has a first end connected to the base of the first initial stage transistor and a second end. The voltage drop element is connected between the second end of the first PN junction element and the first power supply terminal. The first resistor is connected between the base of the second initial stage transistor and a first signal source which is a voltage source. The current-generating transistor has a collector connected to the base of the first initial stage transistor and a base connected to the first signal source. The second resistor is connected between the emitter of the current-generating transistor and the second power supply terminal. The current mirror is connected to the node, and allows a current to flow to the node, the current being identical to a current flowing from the second signal source which is a current source. This variable gain amplifier generates no non-linear distortion, and has a small size.

5 Claims, 8 Drawing Sheets

FOREIGN PATENT DOCUMENTS

| | | |
|---|---|---|
| JP | 61-157108 | 7/1986 |
| JP | 05-029853 | 2/1993 |
| JP | 05-110354 | 4/1993 |
| JP | 10-079633 | 3/1998 |
| JP | 11-068487 | 3/1999 |
| JP | 2001-308662 | 11/2001 |

* cited by examiner

VARIABLE GAIN AMPLIFIER AND AC POWER SUPPLY DEVICE USING THE SAME

TECHNICAL FIELD

The present invention relates to a variable gain amplifier and an alternating current (AC) power-supply device including the amplifier.

BACKGROUND ART

In a conventional variable gain amplifier disclosed in FIG. 1 of Japanese Patent Laid-Open Publication No. 2001-308662, the characteristic of the base-emitter voltage of each of initial stage transistors $Q_1$ and $Q_2$ versus the collector current is expressed as an exponential function, hence providing an output voltage V0 with a non-linear distortion.

In order to reduce this distortion, a resistor is inserted in series to the emitter of each of initial stage transistors Q1 and Q2. This arrangement may reduce the non-linear distortion, but cannot completely eliminate the distortion.

A multiplier circuit provides a variable gain amplifier which does not generate the non-linear distortion in principle. FIG. 7 is a circuit diagram of multiplier circuit 5001. Integrated circuit (IC) 1 includes transconductance amplifier 2 and a pair of PN junction elements 4, and includes seven terminals, that is, power-supply terminal 1A (+Vcc), power-supply terminal 1B (−Vcc), input terminal 1C (INV), input terminal 1D (NI), input terminal 1E (BIAS), input terminal 1F (DB), and output terminal 1G (OUT).

Constant-current supply 101 (ID) is connected to input terminal 1F. Constant power supply 103 ($½I_D$) outputting a ½ of the current from constant current supply 101 and signal input power supply (IX) are connected to input terminal 1C. Current Iout is output from output terminal 1G.

Amplifier 2 includes four current mirrors 5A to 5D and two initial stage transistors Q1 and Q2. Pair of PN junction elements 4 are configured by two diodes $D_1$ and $D_2$.

An operation of multiplier circuit 5001 will be described below.

The following quantity is defined by charge q of an electron, the Boltzmann constant K, and absolute temperature T:

$$VT = K \cdot T/q$$

Voltage $V_{BE}$ between the base and emitter of a transistor is expressed by the following equation with emitter current $I_E$, saturated current $I_{SAT}$ and collector current $I_C$. Base current $I_B$ is much smaller than a collector current, hence providing $I_E \approx I_C$.

$$V_{BE} = V_T \ln(I_E/I_{SAT}) = V_T \ln(I_C/I_{SAT})$$

Forward direction voltage VD of a diode is expressed by the following equation with forward direction current ID of the diode.

$$V_D = V_T \ln(I_D/I_{SAT})$$

The Kirchhoff's law is applied between points A and B shown in FIG. 7, providing the following equations.

$$V_T \ln(I_{D1}/I_{SAT}) + V_T \ln(I_1/I_{SAT}) = V_T \ln(I_{D2}/I_{SAT}) + V_T \ln(I_2/I_{SAT}) \quad \text{(Equation 1)}$$

$$(I_{D1}/I_{SAT}) \cdot (I_1/I_{SAT}) = (I_{D2}/I_{SAT}) \cdot (I_2/I_{SAT})$$

$$I_{D1} \cdot I_1 = I_{D2} \cdot I_2 \quad \text{(Equation 2)}$$

$$I_{D1} = (½) \cdot I_D + I_X \quad \text{(Equation 3)}$$

$$I_{D2} = (½) \cdot I_D - I_X \quad \text{(Equation 4)}$$

$$I_1 = (½) \cdot I_y + I_{out} \quad \text{(Equation 5)}$$

$$I_2 = (½) \cdot I_y - I_{out} \quad \text{(Equation 6)}$$

From Equation 3, Equation 6 is assigned into Equation 2, providing the following equations.

$$I_x \cdot I_y = I_D \cdot I_{out}$$

$$I_{out} = I_x \cdot I_y / I_D \quad \text{(Equation 7)}$$

Based upon Equation 7, when current $I_D$ is constant, the product of input currents Ix and Iy is obtained from output terminal 1G as current Iout. When input current Iy is constant, the dividend obtained by dividing input current Ix by input current $I_D$ is obtained as output current Iout. Equation 7 includes no term of exponential function, and includes only terms of linear function, hence allowing multiplier circuit 5001 to generate no linear distortion in principle. Input current Ix and input current Iy are used as a signal input and a control input, respectively, thereby providing a variable gain amplifier generating no linear distortion in principle.

Multiplier circuit 5001 requires input terminal 1F for inputting a current to IC 1 from constant current supply 101, hence causing IC 1 to include seven terminals. An IC generally includes an even number of terminals, thus IC 1 necessarily includes a package having eight terminals.

Under recent demands for light weight and small electronic apparatuses, it is very important whether the IC package includes eight pins or six pins. In IC 1 accommodating multiplier circuit 5001, an area occupied by pads used for connecting terminals is greater than an area of a chip implementing circuit 5001. Thus, the area of the pads corresponding to the number of terminals influences the area of the chip, and is greatly reflected in the yield and costs.

SUMMARY OF THE INVENTION

A variable gain amplifier includes first and second power supply terminals arranged to be connected to a power supply, a transconductance amplifier, first and second PN junction elements, a voltage drop element, first and second resistors, a current-generating transistor, and a current mirror. The transconductance amplifier outputs a current corresponding to a difference between a potential of a base of the first initial stage transistor and a potential of a base of the second initial stage transistor. An emitter of the second initial stage transistor is connected to the emitter of the first initial stage transistor at a node. Each of the first and second PN junction elements has a first end connected to the base of the first initial stage transistor and a second end. The voltage drop element is connected between the second end of the first PN junction element and the first power supply terminal. The first resistor is connected between the base of the second initial stage transistor and a first signal source which is a voltage source. The current-generating transistor has a collector connected to the base of the first initial stage transistor and a base connected to the first signal source. The second resistor is connected between the emitter of the current-generating transistor and the second power supply terminal. The current mirror is connected to the node, and allows a current to flow to the node, the current being identical to a current flowing from the second signal source which is a current source.

This variable gain amplifier generates no non-linear distortion, and has a small size.

REFERENCE NUMERALS

2 Transconductance Amplifier
3 Voltage Drop Element
4A PN Junction Element (First PN Junction Element)
4B PN Junction Element (Second PN Junction Element)
5C Current Mirror
10A Power Supply Terminal
10B Power Supply Terminal
10G Output Terminal
501 Signal Source (First Signal Source)
502 Signal Source (Second Signal Source)
$FET_1$ Electric Field Effect Transistor
$Q_1$ Initial Stage Transistor (First Initial Stage Transistor)
$Q_2$ Initial Stage Transistor (Second Initial Stage Transistor)
$R_{10}$ Resistor (Second Resistor)
$R_{11}$ Resistor (First Resistor)
$Tr_1$ Current-Generating Transistor

DETAIL DESCRIPTION OF THE PREFERRED EMBODIMENT

Figure 1:
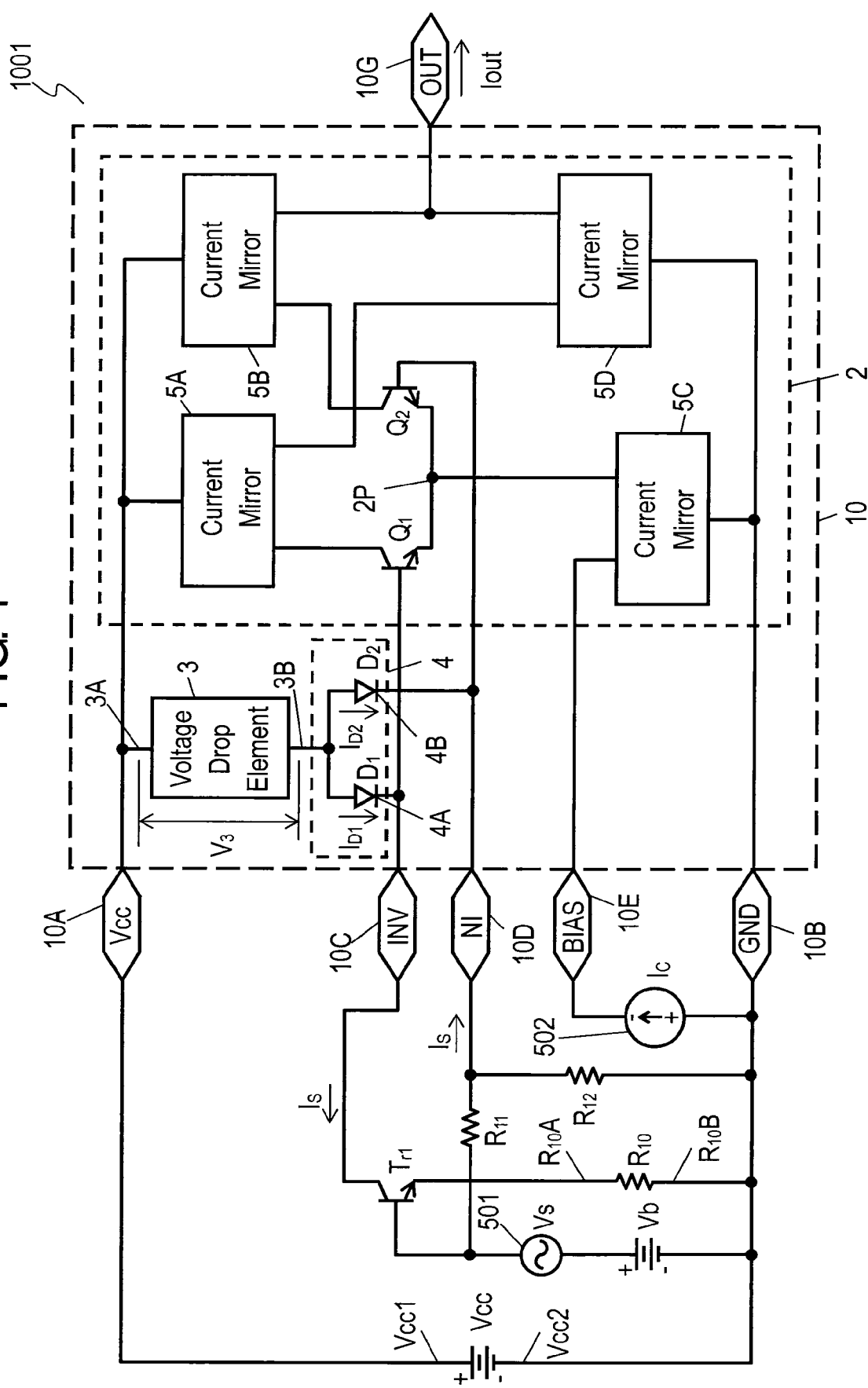
FIG. 1 is a circuit diagram of a variable gain amplifier in accordance with an exemplary embodiment of the present invention.
Figure 7:
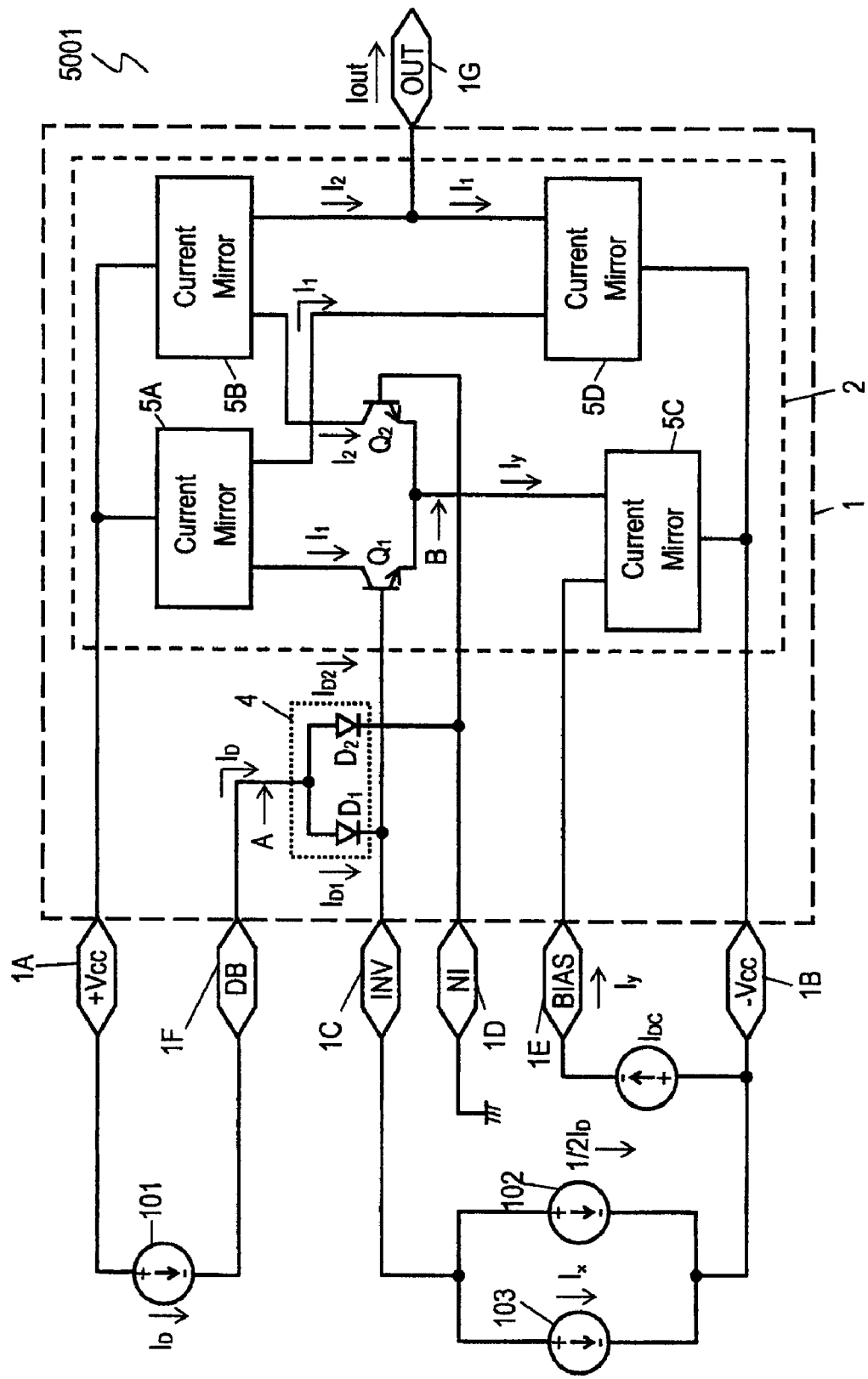
FIG. 7 is a circuit diagram of a conventional variable gain amplifier.

FIG. 1 is a circuit diagram of a variable gain amplifier 1001 including a multiplier circuit in accordance with an exemplary embodiment of the present invention. In FIG. 1, components identical to those of conventional multiplier circuit 5001 shown in FIG. 7 are denoted by the same reference numerals, and their description will be omitted. Unlike conventional multiplier circuit 5001 shown in FIG. 7, variable gain amplifier 1001 shown in FIG. 1 does not require input terminal 1F.

As shown in FIG. 1, integrated circuit (IC) 10 includes transconductance amplifier 2, voltage drop element 3, and a pair of PN junction elements 4A and 4B. IC 10 includes six 6 terminals, that is, power supply terminal 10A (Vcc), input terminal 10C (INV), input terminal 10D (NI), input terminal 10E (BIAS), output terminal 10G (OUT), and power supply terminal 10B (GND) functioning as a ground. Power supply Vcc has an end Vcc1 connected to power supply terminal 10A, and has an end Vcc2 connected to power supply terminal 10B.

PN junction elements 4A and 4B are implemented by diodes $D_1$ and $D_2$, respectively. An end 3A of voltage drop element 3 is connected to power supply terminal 10A (Vcc) so that a voltage dropping by a voltage $V_3$ from the voltage of power supply terminal 10A appears at an end 3B of voltage drop element 3. Respective anodes of diodes $D_1$ and $D_2$ are connected to the end 3B of voltage drop element 3. The cathode of diode $D_1$ is connected to input terminal 10C (INV). The collector of current-generating transistor $Tr_1$ is connected to input terminal 10C, and the emitter of current-generating transistor $Tr_1$ is connected to an end $R_{10}A$ of resistor $R_{10}$. An end $R_{10}B$ of resistor $R_{10}$ is connected to power supply Vcc (power supply terminal 10B). Voltage Vs of signal source 501 is applied to the base of current-generating transistor $Tr_1$. Signal source 501 is biased by DC bias Vb. Input terminal 10D (NI) is connected to signal source 501 via resistor $R_{11}$.

A potential of a node where diode $D_1$ and the collector of current-generating transistor $Tr_1$ is connected and a potential of a node where resistor $R_{11}$ and diode $D_2$ are connected are input as differential inputs to transconductance amplifier 2.

The current flowing in a common emitter of initial stage transistors $Q_1$ and $Q_2$ providing an initial stage differential amplifier of transconductance amplifier 2 is controlled via current mirror 5C by current Ic of signal source 502, a current source.

Transconductance amplifier 2 includes initial stage transistors Q1 and Q2. The emitter of initial stage transistor Q1 is connected to the emitter of initial stage transistor Q2 at a node 2P. Current Iout corresponding to a difference between a potential of the base of initial stage transistor Q1 and a potential of the base of initial stage transistor Q2 is output from output terminal 10G. Diode $D_1$, i.e., PN junction element 4A, has an end (anode) and an end (cathode) that is connected to the base of initial stage transistor Q1. Diode $D_2$, i.e., PN junction element 4B, has an end (anode) and an end (cathode) that is connected to the base of initial stage transistor Q2. The cathodes of diodes $D_1$ and $D_2$ are connected to each other. Voltage drop element 3 is connected between the cathodes of diodes $D_1$ and $D_2$ and power supply terminal 10A. Resistor $R_{11}$ is connected between the base of initial stage transistor Q2 and signal source 501, a voltage source. The collector of current-generating transistor $Tr_1$ is connected to the base of initial stage transistor $Q_1$. The base of current-generating transistor $Tr_1$ is connected to signal source 501. Resistor $R_{10}$ is connected between power supply terminal 10B and the emitter of current-generating transistor $Tr_1$. Current mirror 5C is connected to the node 2P to cause a current identical to current Ic flowing from signal source 501, the current source, to flow in the node 2P. That is, current mirror 5C makes the sum of currents flowing through the emitters of initial stage transistors Q1 and Q2 equal to current Ic.

In variable gain amplifier 1001 according to the embodiment, while the sum (current $I_D$) of currents $I_{D1}$ and $I_{D2}$ flowing in diodes $D_1$ and $D_2$ is kept constant, an input signal is added to current $I_{D1}$, and current Ic is applied to the BIAS terminal. Similarly to conventional multiplier circuit 5001 shown in FIG. 7, according to Equations 1 to 7, when ID is constant, the product of input currents Is and Ic is obtained from output terminal 10G as current Iout, thus providing a multiplying function.

A method for adding an input signal to current $I_{D1}$ while the sum (current ID) of currents $I_{D1}$ and $I_{D2}$ is kept constant will be described. Each of resistors $R_{10}$ and $R_{11}$ has a resistance R. A voltage (0.7V) between the base and emitter of current-generating transistor $Tr_1$ will be neglected.

$$I_{D1}=(Vb+Vs)/R$$

$$I_{D2}=(Vcc-V_3-(Vb+Vs))/R$$

$$I_{D1}+I_{D2}=(Vcc-V_3)/R$$

Thus, the sum ($I_{D1}+I_{D2}$) of currents $I_{D1}$ and $I_{D2}$ is constant regardless of voltage Vs of signal source 501.

If an offset is to be adjusted, resistor $R_{12}$ is adjusted so that currents $I_{D1}$ and $I_{D2}$ are equal to each other when no signal is input (Vs=0). Therefore, upon amplifying an alternating-current (AC) signal without taking a direct-current component into consideration, $R_{12}$ may not be necessary.

In FIG. 1, current-generating transistor $Tr_1$ and resistors $R_{10}$ and $R_{11}$ input voltage Vs of signal source 501 to input terminals 10C and 10D as input current Is. Currents $I_{D1}$ and $I_{D2}$ flowing in diodes $D_1$ and $D_2$ have phases opposite to each other.

In FIG. 1, a term of Equation 7 is expressed by the following equation.

$$I_D = I_{D1} + I_{D2}$$

$$Ix = Is$$

$$Iy = Ic$$

From Equation 7, output current Iout is expressed by the following equation.

$$Iout = Is \cdot Ic / (I_{D1} + I_{D2})$$

Since $(I_{D1} + I_{D2})$ is constant regardless of voltage Vs, the gain of variable gain amplifier 1001 shown in FIG. 1 is determined by current Ic to be input to input terminal 10E. Since this equation includes only the term of linear function, variable gain amplifier 1001 does not generate any non-linear distortion in principle. That is, the ratio of current Iout output from output terminal 10G to voltage Vs of signal source 501 of transconductance amplifier 2 is variable according to current Ic flowing from signal source 502.

Diodes $D_1$ and $D_2$ and initial stage transistors $Q_1$ and $Q_2$ need to be kept at the same temperature so as to perform the multiplying function accurately, and are preferably arranged on a single silicon substrate as an IC. Diodes $D_1$ and $D_2$, a pair of PN junction elements 4A and 4B, preferably have the same characteristics and the same junction temperature, and are preferably placed inside the IC.

As described above, according to the embodiment, IC 10 has six terminals, and accommodated in a package identical to that of a small-signal transistor, which is the smallest IC, effectively meeting demands for thin and small-size electronic apparatuses. IC 10 includes the six terminals, and has an area of a chip much smaller than that of an IC including eight pins, being advantageous from the viewpoints of yield and cost.

Figure 2:
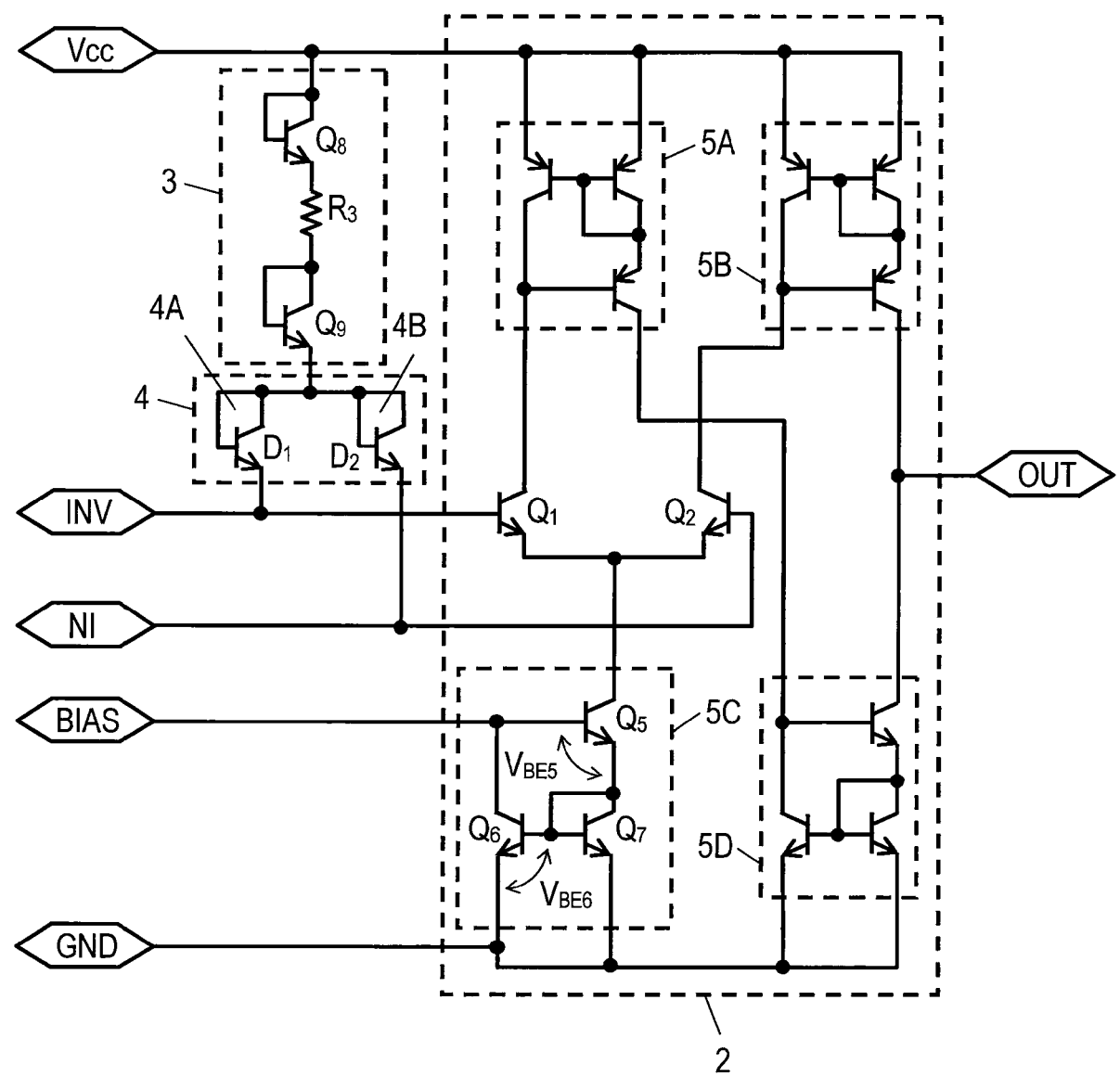
FIG. 2 is a circuit diagram of an integrated circuit of the variable gain amplifier in accordance with the embodiment.

FIG. 2 is a circuit diagram of integrated circuit 10 for showing transconductance amplifier 2 and voltage drop element 3. In the case that diodes $D_1$ and $D_2$ of PN junction elements 4A and 4B are configured by an IC, transistors with diode-connection, i.e., with the collector and the base of each of the transistors being connected to each other, are actually used as diodes $D_1$ and $D_2$.

Transconductance amplifier 2 is configured by four current mirrors 5A to 5D and two initial stage transistors $Q_1$ and $Q_2$. Each of current mirrors 5A to 5D is configured by three transistors $Q_5$, $Q_6$, and $Q_7$.

Voltage drop element 3 applies appropriate potentials input to transconductance amplifier 2, that is, to the bases of initial stage transistors $Q_1$ and $Q_2$. Element 3 includes two transistors $Q_8$ and $Q_9$ that utilize a forward-direction voltage drop of diode and resistor $R_3$ as an impedance element connected between transistors $Q_8$ and $Q_9$. Voltage drop element 3 may be an element, such as a zener diode, that drops a voltage.

Figure 3:
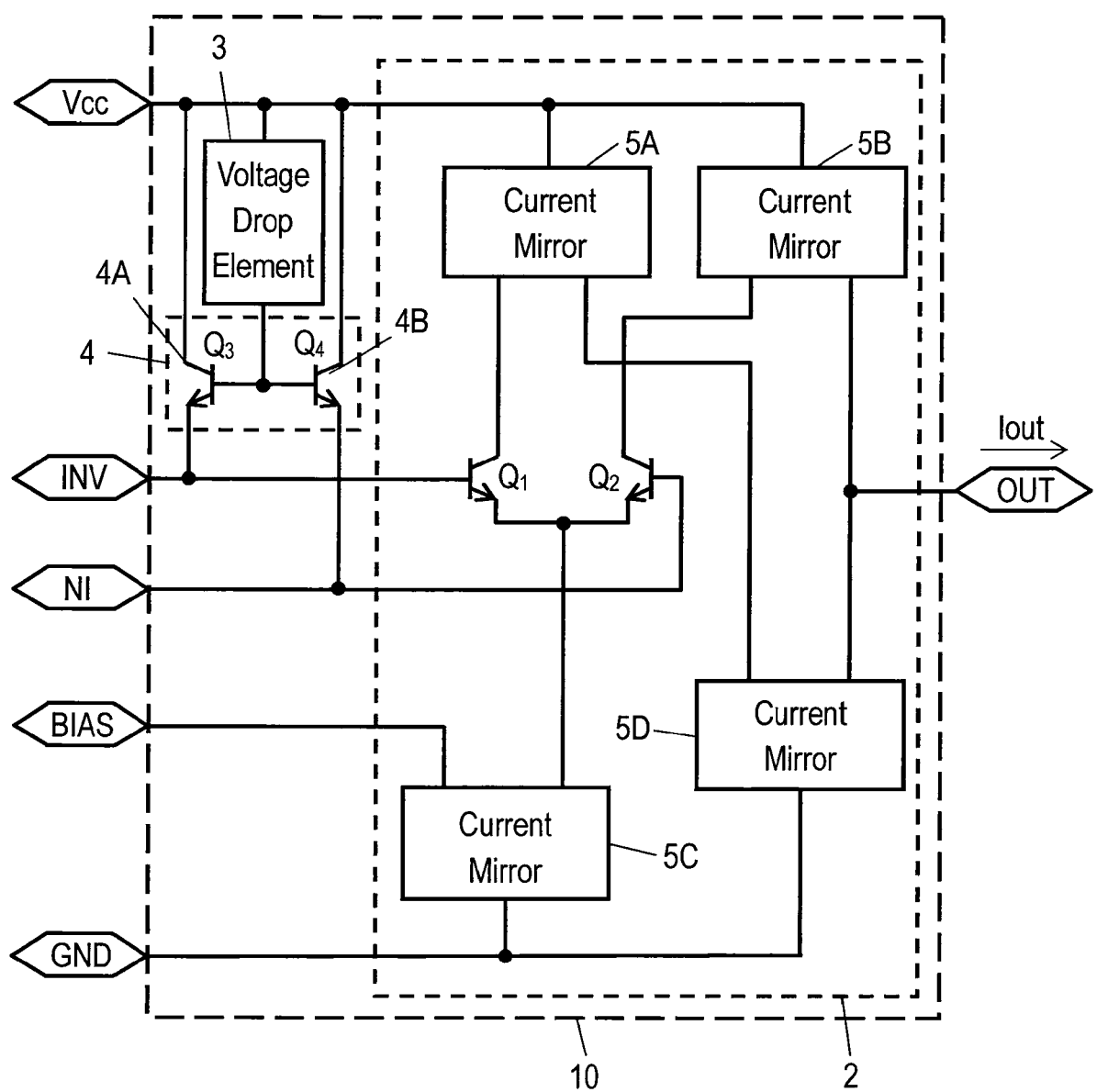
FIG. 3 is a circuit diagram of another integrated circuit of the variable gain amplifier in accordance with the embodiment.

FIG. 3 is another circuit diagram of integrated circuit 10. As shown in FIG. 3, PN junction elements 4A and 4B are implemented by a PN junction between the base and emitter of each of transistors $Q_3$ and $Q_4$.

Figure 4A:
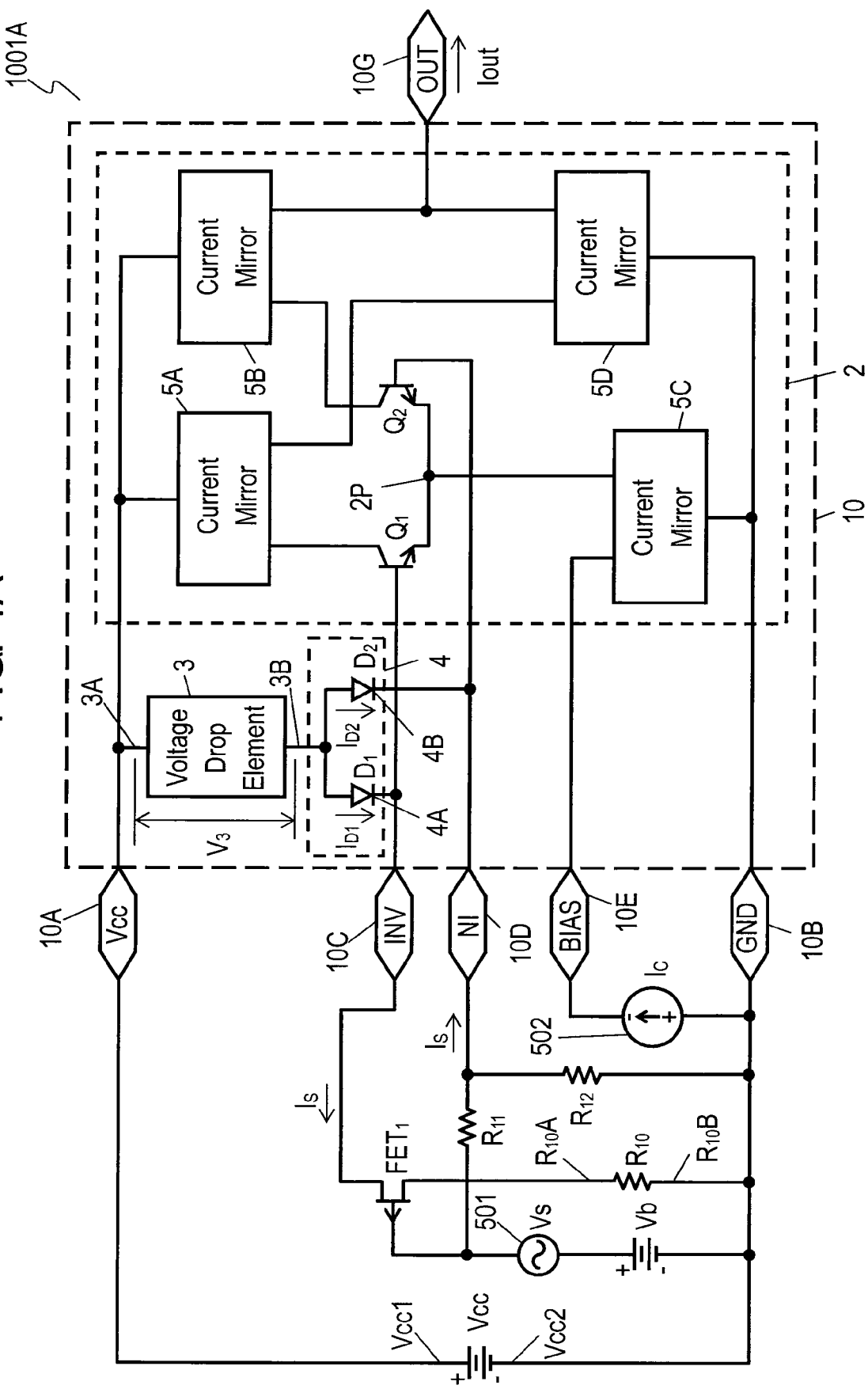
FIG. 4A is a circuit diagram of another variable gain amplifier in accordance with the embodiment.

FIG. 4A is a circuit diagram of variable gain amplifier 1001A according to the embodiment. Variable gain amplifier 1001A includes field effect transistor $FET_1$ instead of current-generating transistor Tr1 of variable gain amplifier 1001 shown in FIG. 1. The drain, the gate and the source of field effect transistor $FET_1$ are connected instead of the collector, the base, and the emitter of current-generating transistor $Tr_1$, respectively.

Figure 4B:
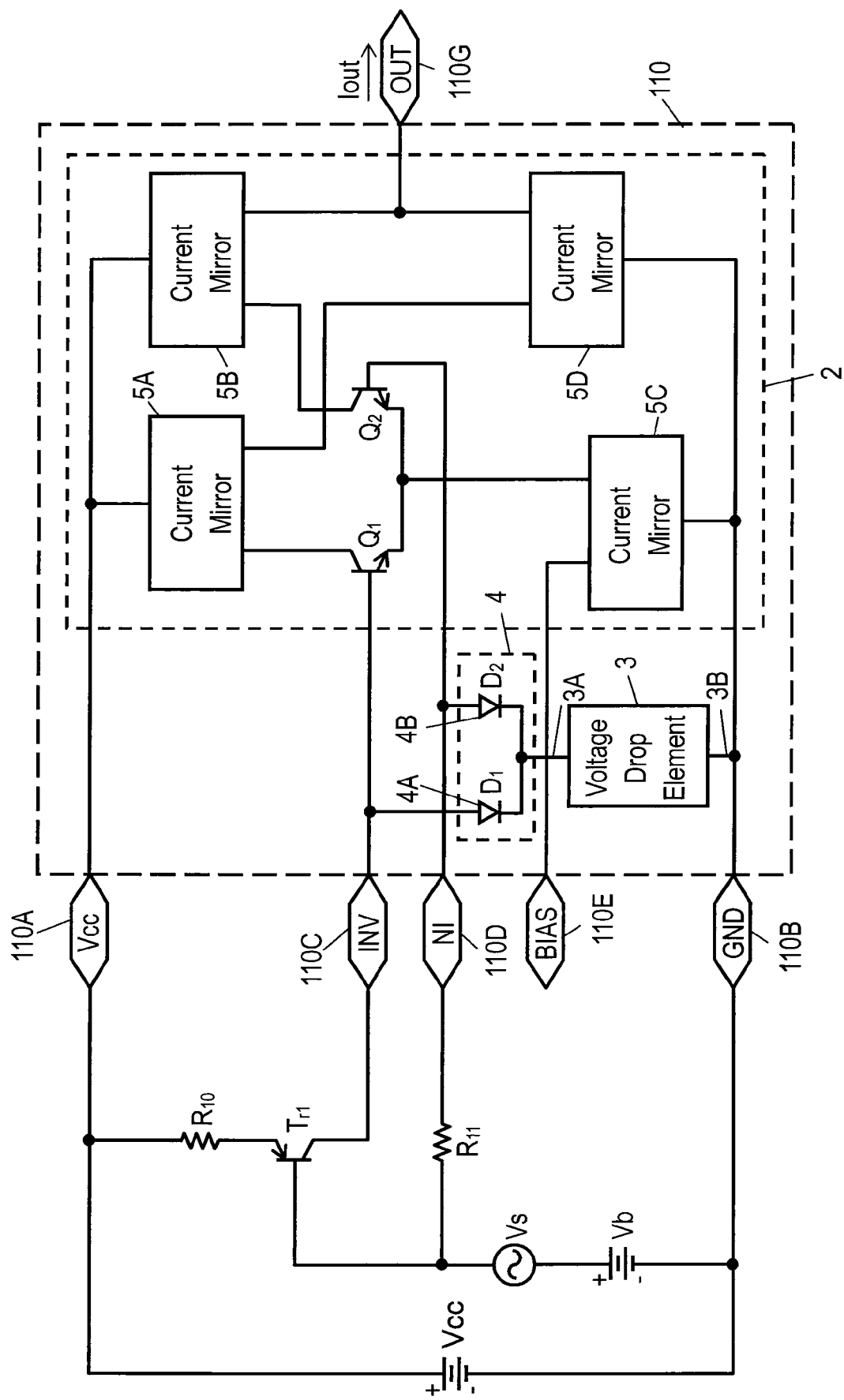
FIG. 4B is a circuit diagram of still another variable gain amplifier in accordance with the embodiment.

FIG. 4B is a circuit diagram of another IC 110 of variable gain amplifier 1001 according to the embodiment. IC 110 has an arrangement of voltage drop element 3, PN junction elements 4A and 4B, current-generating transistor $Tr_1$, and resistor $R_{10}$ is opposite to that of IC 10 shown in FIG. 1, and the other portions are arranged in the same manner. That is, the anode of diode $D_1$ is connected to input terminal 110C and the base of initial stage transistor $Q_1$, and the anode of diode $D_2$ is connected to input terminal 110D and the base of transistor $Q_2$. The cathodes of diode D1 and D2 are connected to end 3A of voltage drop element 3. End 3B of voltage drop element 3 is connected to power supply terminal 110B connected to the ground. IC 110 provides the same effects as those of IC 10 shown in FIG. 1. In FIG. 4B, resistor $R_{12}$ for adjusting offset is omitted.

Figure 5:
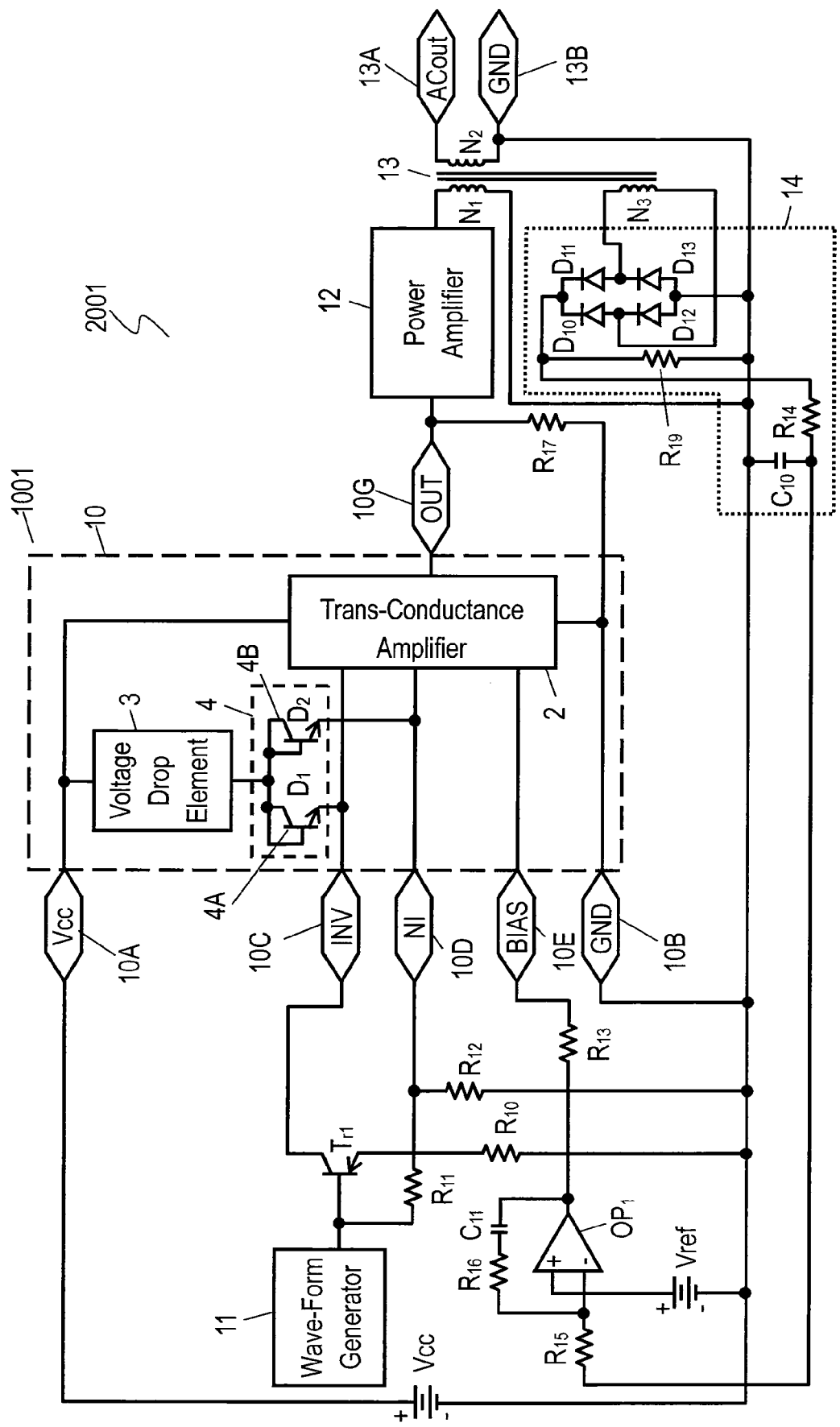
FIG. 5 is a circuit diagram of an alternating-current (AC) power-supply device in accordance with the embodiment.

FIG. 5 is a circuit diagram of showing alternating-current (AC) constant voltage power supply device 2001 including variable gain amplifier 1001 according to the embodiment. Wave-form generator 11 generates a waveform of an AC voltage to be desirably obtained as an output. In order to generate an AC voltage having a sine wave form, wave-form generator 11 generates a sine wave voltage. The sine wave voltage output from wave-form generator 11 is applied to current-generating transistor $Tr_1$ and resistor $R_{11}$ so that sine wave current Iout is obtained from output terminal 10G of IC 10. Resistor $R_{17}$ converts sine wave current Iout output from IC 10 into a sine wave voltage. This sine wave voltage is input to power amplifier 12.

The sine wave voltage input to power amplifier 12 is amplified, and is applied to primary coil $N_1$ of transformer 13 for driving transformer 13. A sine wave AC voltage is output from secondary coil $N_2$ of transformer 13 via output terminals 13A and 13B.

Tertiary coil $N_3$ of the transformer generates an AC voltage in proportion to the output AC voltage, and the AC voltage is converted into a pulsating voltage by a rectifier circuit configured by diodes $D_{10}$, $D_{11}$, $D_{12}$, and $D_{13}$ and resistor $R_{19}$. Resistor $R_{19}$ is a dummy load resistor for obtaining an appropriate pulsating voltage. The pulsating voltage is smoothed by a low pass filter configured by resistor $R_{14}$ and capacitor $C_{10}$, providing a direct-current (DC) voltage in proportion to the AC voltage output from output terminals 13A and 13B. That is, the rectifier circuit and the low pass filter provides output voltage detector 14 that detects the AC voltage output from output terminals 13A and 13B, and generates the DC voltage as a detection signal.

Comparator $OP_1$ compares the DC voltage with reference voltage Vref, and outputs a voltage corresponding to a difference obtained by subtracting the DC voltage from reference voltage Vref. The output voltage is input to input terminal 10E of IC 10 as current Ic via resistor $R_{13}$. If the DC voltage is lowered to increase the difference from reference voltage Vref, the voltage output from by comparator OP1 increases as to allow variable gain amplifier 1001 to increase the AC voltage output from output terminals 13A and 13B. The AC voltage output through such a negative feedback is stabilized. If the output voltage is changed, reference voltage Vref is changed, or the voltage output from output voltage detector 14 is voltage-divided and changed. Resistors $R_{15}$ and $R_{16}$ and capacitor $C_{11}$ constitute a phase compensating circuit used for stably performing the negative feedback. Output voltage detector 14, comparator $OP_1$, reference voltage Vref, resistors $R_{13}$, $R_{15}$, and $R_{16}$, and capacitor $C_{11}$ provide a feedback circuit that feedbacks the amplitude of the output AC voltage as current Ic.

Figure 6:
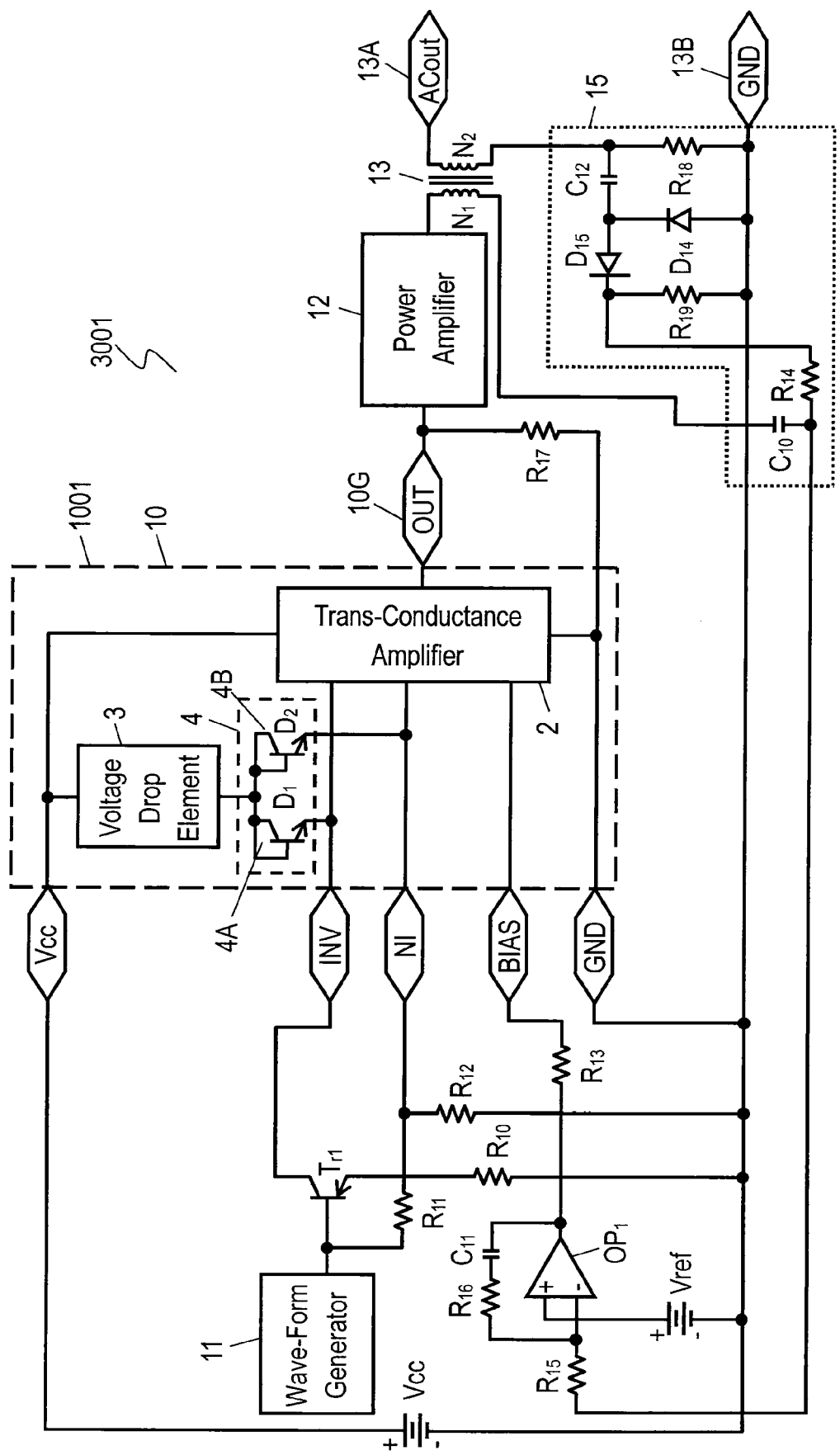
FIG. 6 is a circuit diagram of another AC power-supply device in accordance with the embodiment.

FIG. 6 is a circuit diagram of AC constant current power-supply device 3001 in accordance with this embodiment. In FIG. 6, components identical to those of AC constant voltage power supply device 2001 are denoted by the same reference numerals, and their description will be omitted. Resistor $R_{18}$ generates an AC voltage in proportion to an AC current flowing in output terminals 13A and 13B. The generated AC voltage is converted into a DC voltage by a rectifier circuit including diodes $D_{15}$ and $D_{14}$ and a low pass filter including capacitor $C_{10}$ and resistor $R_{14}$. That is, the rectifier circuit and the low pass filter provides output current detector 15 for detecting an AC current flowing in output terminals 13A and 13B, and outputs a DC voltage in proportional to the current. Similarly to constant voltage power supply device 2001 shown in FIG. 5, comparator $OP_1$ outputs a voltage corresponding to a difference obtained by subtracting the DC voltage from reference voltage Vref. IC 10 drives transformer 13 via power amplifier 12 in accordance with the voltage output from comparator $OP_1$ so that a DC voltage output from output current detector 15 becomes identical to reference voltage Vref. This operation stabilizes the current flowing through output terminals 13A and 13B as a constant current. Resistor $R_{19}$ is a dummy load resistor for setting a pulsating voltage output from the rectifier circuit to an appropriate level. Output current detector 15, comparator $OP_1$, reference voltage Vref, and resistor $R_{11}$ provide a feedback circuit that feedbacks the amplitude of the output AC voltage as current Ic.

Variable gain amplifier 1001 in accordance with the embodiment provides AC power supply devices 2001 and 3001 outputting a constant voltage and a constant current which are variable, respectively.

INDUSTRIAL APPLICABILITY

This variable gain amplifier generates no non-linear distortion, and has a small size, being applicable to an AC power supply device outputting a variable current. This, variable gain amplifier is useful for various power supply devices and power systems, such as uninterruptive power supply devices and electrophotographic processing power supply devices for photocopy machines, printers.

The invention claimed is:

1. A variable gain amplifier comprising:
a first power supply terminal arranged to be connected to a first end of a power supply;
a second power supply terminal arranged to be connected to a second end of the power supply;
a transconductance amplifier including
a first initial stage transistor having an emitter, a base and a collector,
a second initial stage transistor having an emitter connected to the emitter of the first initial stage transistor at a node, a base and a collector, and
an output terminal for outputting a current corresponding to a difference between a potential of the base of the first initial stage transistor and a potential of the base of the second initial stage transistor;
a first PN junction element having a first end connected to the base of the first initial stage transistor and a second end;
a second PN junction element having a first end connected to the base of the second initial stage transistor and a second end connected to the second end of the first PN junction element;
a voltage drop element connected between the second end of the first PN junction element and the first power supply terminal;
a first resistor connected between the base of the second initial stage transistor and a first signal source serving which is a voltage source;
a current-generating transistor having a collector connected to the base of the first initial stage transistor, a base connected to the first signal source, and an emitter;
a second resistor connected between the emitter of the current-generating transistor and the second power supply terminal; and
a current mirror connected to the node, the current mirror allowing a current to flow to the node, the current being identical to a current flowing from a second signal source which is a current source.

2. The variable gain amplifier according to claim 1, wherein a ratio of the current output from the output terminal to a voltage of the first signal source of the transconductance amplifier is variable according to the current flowing from the second signal source.

3. The variable gain amplifier according to claim 1, further comprising an integrated circuit accommodating the first PN junction element, the second PN junction element, the transconductance amplifier, and the current mirror, the integrated circuit including
a first input terminal connected to the base of the first initial stage transistor,
a second input terminal connected to the base of the second initial stage transistor,
a third input terminal which is a node where the current mirror is connected to the second signal source,
the first power supply terminal,
the second power supply terminal, and
the output terminal of the transconductance amplifier.

4. The variable gain amplifier according to claim 1, further comprising a field effect transistor instead of the current-generating transistor, wherein a drain, a gate, and a source of the field effect transistor are connected instead of the collector, the base, and the emitter of the current-generating transistor, respectively.

5. An alternating-current (AC) power supply device comprising:
the variable gain amplifier according to any one of claims 1 to 3;
a wave-form generator serving as the first signal source;
a power amplifier amplifying the current output from the output terminal of the transconductance amplifier, and outputs an AC power; and
a feedback circuit that feedbacks an amplitude of the output AC power as the current flowing from the second signal source.

* * * * *

UNITED STATES PATENT AND TRADEMARK OFFICE
CERTIFICATE OF CORRECTION

PATENT NO.        : 7,602,247 B2
APPLICATION NO.   : 11/915018
DATED             : October 13, 2009
INVENTOR(S)       : Masafumi Nakamura It is certified that error appears in the above-identified patent and that said Letters Patent is hereby corrected as shown below:

On the Title page, section (87), please delete the PCT Pub Date of "Mar. 3, 2007" and insert therefor --Mar. 8, 2007--.

In Column 7, line 30, please delete "R11" and insert therefore --RI9--.

Signed and Sealed this

Fifteenth Day of December, 2009

David J. Kappos
*Director of the United States Patent and Trademark Office*